United States Patent
Angioni et al.

(10) Patent No.: US 10,991,900 B2
(45) Date of Patent: Apr. 27, 2021

(54) CROSSLINKED EMISSIVE LAYER CONTAINING QUANTUM DOTS FOR LIGHT-EMITTING DEVICE AND METHOD FOR MAKING SAME

(71) Applicant: Sharp Kabushiki Kaisha, Osaka (JP)

(72) Inventors: Enrico Angioni, Oxford (GB); James Andrew Robert Palles-Dimmock, Oxford (GB); Edward Andrew Boardman, Abingdon (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/725,627

(22) Filed: Dec. 23, 2019

(65) Prior Publication Data

US 2020/0136076 A1 Apr. 30, 2020

Related U.S. Application Data

(62) Division of application No. 15/937,073, filed on Mar. 27, 2018, now Pat. No. 10,581,007.

(51) Int. Cl.
*H01L 51/50* (2006.01)
*H01L 51/56* (2006.01)
(Continued)

(52) U.S. Cl.
CPC ............ *H01L 51/502* (2013.01); *H01L 33/06* (2013.01); *H01L 51/5056* (2013.01);
(Continued)

(58) Field of Classification Search
CPC ... H01L 51/502; H01L 51/5096; H01L 33/06; H01L 51/56; H01L 51/5234;
(Continued)

(56) References Cited

U.S. PATENT DOCUMENTS

| 7,910,400 B2 | 3/2011 | Kwon et al. |
| 2005/0208328 A1* | 9/2005 | Hsu ........................ B82Y 10/00 428/690 |

(Continued)

FOREIGN PATENT DOCUMENTS

| CN | 105062462 A | 11/2015 |
| IN | 201747022708 A | 7/2017 |

(Continued)

OTHER PUBLICATIONS

Official Action for related U.S. Appl. No. 16/369,755 dated Dec. 27, 2019.

(Continued)

*Primary Examiner* — David Vu
(74) *Attorney, Agent, or Firm* — Renner, Otto, Boisselle & Sklar, LLP

(57) ABSTRACT

A light-emitting device includes an anode; a cathode; and an emissive layer disposed between the anode and the cathode, the emissive layer including quantum dots dispersed in a crosslinked matrix formed from one or more crosslinkable charge transport materials. A method of forming the emissive layer of a light-emitting device includes depositing a mixture including quantum dots and one or more crosslinkable charge transport materials on a layer; and subjecting at least a portion of the mixture to UV activation to form an emissive layer including quantum dots dispersed in a crosslinked matrix.

20 Claims, 6 Drawing Sheets

(51) Int. Cl.
   *H01L 33/06*   (2010.01)
   *H01L 51/52*   (2006.01)
   *B82Y 20/00*   (2011.01)

(52) U.S. Cl.
   CPC ...... *H01L 51/5072* (2013.01); *H01L 51/5092* (2013.01); *H01L 51/5096* (2013.01); *H01L 51/5218* (2013.01); *H01L 51/5234* (2013.01); *H01L 51/56* (2013.01); *B82Y 20/00* (2013.01)

(58) Field of Classification Search
   CPC ............. H01L 51/5092; H01L 51/5072; H01L 51/5056; H01L 51/5218; H01L 51/0035; B82Y 20/00
   See application file for complete search history.

(56) References Cited

U.S. PATENT DOCUMENTS

| | | |
|---|---|---|
| 2008/0206565 A1 | 8/2008 | Takahashi et al. |
| 2016/0218308 A1 | 7/2016 | Desilvestro |
| 2017/0155051 A1 | 6/2017 | Torres Cano et al. |
| 2017/0183567 A1 | 6/2017 | Zhou et al. |

FOREIGN PATENT DOCUMENTS

| | | |
|---|---|---|
| WO | WO 2017/117994 A1 | 7/2017 |
| WO | WO 2017/121163 A1 | 7/2017 |

OTHER PUBLICATIONS

Park et al., Alternative Patterning Process for Realization of Large-Area, Full-Color, Active Quantum Dot Display, Nano Letters, 2016, pp. 6946-6953.
Official Action for related U.S. Appl. No. 16/369,755 dated Jul. 29, 2019.
Allowed claims of co-pending related U.S. Appl. No. 15/937,073, filed Mar. 27, 2018.
Pending claims of co-pending related U.S. Appl. No. 16/369,755, filed Mar. 29, 2019.
Pending claims of co-pending related U.S. Appl. No. 16/725,578, filed Dec. 23, 2019.
Official Action for related U.S. Appl. No. 15/937,073 dated Jan. 31, 2019.
Official Action for related U.S. Appl. No. 15/937,073 dated Apr. 5, 2019.
Official Action for related U.S. Appl. No. 16/725,578 dated Sep. 2, 2020.

\* cited by examiner

CROSSLINKED EMISSIVE LAYER CONTAINING QUANTUM DOTS FOR LIGHT-EMITTING DEVICE AND METHOD FOR MAKING SAME

RELATED APPLICATION DATA

This application is a divisional of U.S. patent application Ser. No. 15/937,073, filed Mar. 27, 2018, the disclosure of which is herein incorporated by reference in its entirety.

TECHNICAL FIELD

The invention relates to light-emitting devices, and in particular to light-emitting devices including a crosslinked emissive layer containing nanoparticles. The light-emitting devices may be implemented in display applications, for example high resolution, multicolor displays. The invention further relates to methods of manufacturing said light-emitting devices.

BACKGROUND ART

A common architecture for a light-emitting device includes an anode, which acts as hole injector; a hole transport layer disposed on the anode; an emissive material layer disposed on the hole transport layer; an electron transport layer disposed on the emissive material layer; and a cathode, which also acts as electron injector, disposed on the electron transport layer. When a forward bias is applied between the anode and cathode, holes and electrons are transported in the device through the hole transport layer and electron transport layer, respectively. The holes and electrons recombine in the emissive material layer, which emits light.

When the emissive material layer includes an organic material, the light-emitting device is referred to as an organic light emitting diode (OLED). When the emissive material layer includes nanoparticles, sometimes known as quantum dots (QDs), the device is commonly called either a quantum dot light emitting diode (QLED, QD-LED) or an electroluminescent quantum dot light emitting diode (ELQLED).

In order to include QLEDs in multicolor high-resolution displays, different manufacturing methods have been designed. These methods are based on disposing three different types of QDs in three different regions of a substrate such that they emit (through electrical injection, i.e., by electroluminescence) at three different colors: red (R), green (G), and blue (B). Sub-pixels that respectively emit red, green, or blue light may collectively form a pixel, which in-turn may be a part of an array of pixels of the display.

U.S. Pat. No. 7,910,400 (Kwon et al., published Mar. 22, 2011) describes that QD films can be made more uniform using wet-type film exchanging ligand processes where QDs can be connected to each other using organic ligands with particular functional groups at both ends (e.g. thiol, amine, carboxyl functional groups).

United States Patent Application Publication No. US 2017/0155051 (Torres Cano et al., published Jun. 1, 2017) describes that QDs can be synthesized with polythiol ligands, and can lead to better packing when deposited and further cured by thermal processes.

International Application Publication No. WO 2017/117994 (Li et al., published Jul. 13, 2017) describes that through an external energy stimuli (e.g. pressure, temperature or UV irradiation) QDs which emit different colors can be selectively attached to bonding surfaces. Surfaces and ligands of QDs must contain particular ending functional groups (e.g. alkenes, alkynes, thiols) in order to be selectively strongly bonded to each other through chemistry reactions.

This concept is further expanded in International Application Publication No. WO 2017/121163 (Li et al., published Jul. 20, 2017), where QDs with R, G and B emission colors can be patterned separately using cross-linkable ligands and organic connectors through chemistry reactions that are activated selectively with UV radiations at different monochromatic wavelengths.

Park et al., *Alternative Patterning Process for Realization of Large-Area, Full-Color, Active Quantum Dot Display*, Nano Letters, 2016, pages 6946-6953 describes that QDs with R, G and B emission colors are patterned combining conventional photolithography and layer by layer assembly. QD layers are deposited selectively on activated (charged) surfaces.

CITATION LIST

U.S. Pat. No. 7,910,400 (Kwon et al., published Mar. 22, 2011).
US 2017/0155051 (Torres Cano et al., published Jun. 1, 2017).
WO 2017/117994 (Li et al., published Jul. 13, 2017).
WO 2017/121163 (Li et al., published Jul. 20, 2017).
Park et al., *Alternative Patterning Process for Realization of Large-Area, Full-Color, Active Quantum Dot Display*, Nano Letters, 2016, pages 6946-6953.

SUMMARY OF INVENTION

In order to fabricate high resolution displays, light-emitting devices including quantum dots (QDs) that emit different colors need to be selectively deposited in certain patterns (e.g., sub-pixel arrangements). In accordance with the present disclosure, methods of producing the light-emitting device may allow for subpixel arrangements to be provided that are sufficiently small for use in a high-resolution display structure. The methods may allow for subpixel structures to be provided that are smaller than those attainable by conventional inkjet printing methods.

Furthermore, the light-emitting device produced in accordance with the present disclosure may possess one or more improved properties. For example, the materials and structure of the light-emitting device of the present disclosure may promote stability of the crosslinked matrix, even upon exposure to ambient UV light (e.g. the emission received from the sun). As another example, the long-term stability and performance of the QDs of the light emitting device of the present disclosure may be improved. The QDs being dispersed in an organic matrix may be protected from moisture, humidity, and/or reactive oxygen species (e.g. peroxides, superoxide, hydroxyl radical, and singlet oxygen). This may reduce or prevent the device from exhibiting a change in light output during aging either with or without electrical bias applied.

In accordance with one aspect of the present disclosure, a light-emitting device includes: an anode; a cathode; and an emissive layer disposed between the anode and the cathode, the emissive layer including quantum dots dispersed in a crosslinked matrix formed from one or more crosslinkable charge transport materials.

In some embodiments, the quantum dots form part of the crosslinked matrix.

In some embodiments, the quantum dots include ligands having one or more functional groups.

In some embodiments, the one or more crosslinkable charge transport material includes one or more hole transport materials.

In some embodiments, the one or more crosslinkable charge transport material includes one or more electron transport materials.

In some embodiments, the light-emitting device further includes a hole transport layer disposed between the anode and the emissive layer. The hole transport layer may be crosslinked with the matrix of the emissive layer. The light-emitting device may further include a hole injection layer disposed between the anode and the hole transport layer.

In some embodiments, the light-emitting device further includes an electron transport layer disposed between the cathode and the emissive layer. The electron transport layer may be crosslinked with the matrix of the emissive layer.

In some embodiments, the emissive layer further includes one or more photo initiators.

In accordance with another aspect of the present disclosure, a pixel of a display includes an arrangement of subpixels, at least one of the subpixels including an instance of the light-emitting device of the present disclosure. The subpixels may be respectively configured such that they produce different respective colors.

In accordance with another aspect of the present disclosure, a method of forming an emissive layer of a light-emitting device includes: depositing a mixture including quantum dots and one or more crosslinkable charge transport materials on a layer; and subjecting at least a portion of the mixture to UV activation to form an emissive layer including quantum dots dispersed in a crosslinked matrix.

In some embodiments, the quantum dots form part of the crosslinked matrix.

In some embodiments, the quantum dots include ligands at their outer surface.

In some embodiments, the mixture further including a photo initiator.

In some embodiments, the layer is an electrode.

In some embodiments, the layer is a hole transport layer.

In some embodiments, the hole transport layer includes a crosslinkable hole transport material, and the UV activation crosslinks the hole transport layer with the matrix of emissive layer.

In some embodiments, the layer is an electron transport layer. The electron transport layer may include a crosslinkable electron transport material, and the UV activation may crosslink the electron transport layer with the matrix of emissive layer.

The foregoing and other features of the invention are hereinafter described in greater detail with reference to the accompanying drawings.

DESCRIPTION

Figure 1:
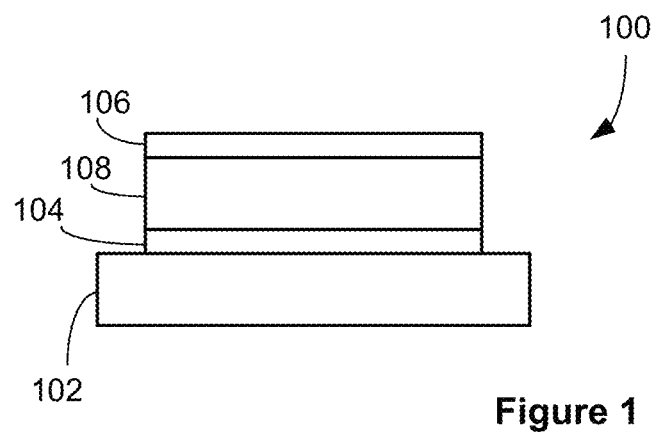
FIG. 1 is a schematic cross-sectional view of an exemplary light-emitting device in accordance with the present disclosure.

Referring now to the drawings in detail and initially to FIG. 1, an exemplary light-emitting device is indicated generally by reference numeral 100. As shown, a stack of layers is provided on a substrate 102. The layers include electrodes 104, 106 and an emissive layer 108 disposed between the electrodes. In some embodiments, such as the one shown, the stack is formed such that the anode is proximate the substrate. Accordingly, in the illustrated embodiment, the order of the layers moving away from the substrate is an anode 104, emissive layer 108, and cathode 106. Although not specifically shown, in other embodiments, the layers may be stacked on the substrate in reverse order such that the cathode is proximate the substrate. During operation, a bias may be applied between the anode 104 and the cathode 106. The cathode 106 injects electrons into the emissive layer 108. Likewise, the anode 104 injects holes into the emissive layer. The electrons and holes radiatively recombine and light is emitted.

The substrate 102 may be made from any suitable material(s). Exemplary substrates include glass substrates and polymer substrates. More specific examples of substrate material(s) include polyimides, polyethenes, polyethylenes, polyesters, polycarbonates, polyethersulfones, polypropylenes, and/or polyether ether ketones. The substrate 102 may be any suitable shape and size. In some embodiments, the dimensions of the substrate allow for more than one light-emitting device to be provided thereon. In an example, a major surface of the substrate may provide an area for multiple light-emitting devices to be formed as sub-pixels of a pixel. In another example, a major surface of the substrate may provide an area for multiple pixels to be formed thereon, each pixel including a sub-pixel arrangement of light-emitting devices.

The electrodes 104, 106 may be made from any suitable material(s). In some embodiments, at least one of the electrodes is a transparent or semi-transparent electrode. In some embodiments, at least one of the electrodes is a reflective electrode. In some embodiments, one of the electrodes is a transparent or semi-transparent electrode and the other electrode is a reflective electrode. Exemplary electrode materials include one or more metals (e.g., aluminum, gold, silver, platinum, magnesium and the like and alloys thereof) or metal oxides (e.g., indium tin oxide, indium-doped zinc oxide (IZO), fluorine doped tin oxide (FTO), aluminum-doped zinc-oxide (AZO), indium-doped cadmium-oxide, and the like). The electrodes 104, 106 may also be provided in any suitable arrangement. As an example, the electrodes 104, 106 may address a thin-film transistor (TFT) circuit.

Figure 2:
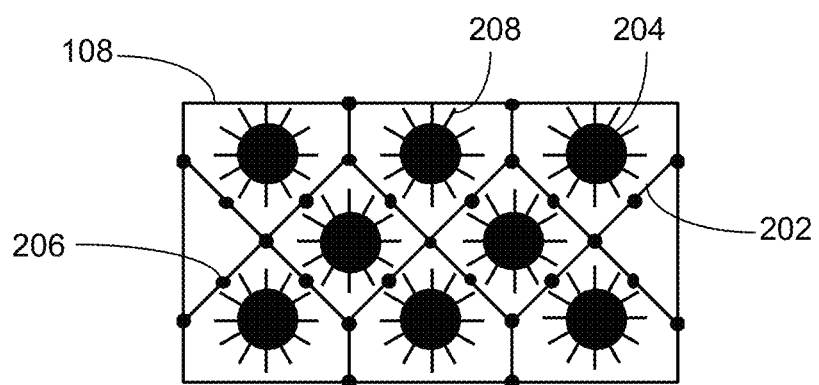
FIGS. 2 and 3 are schematic cross-sectional views of exemplary crosslinked emissive layers in accordance with the present disclosure.
Figure 3:
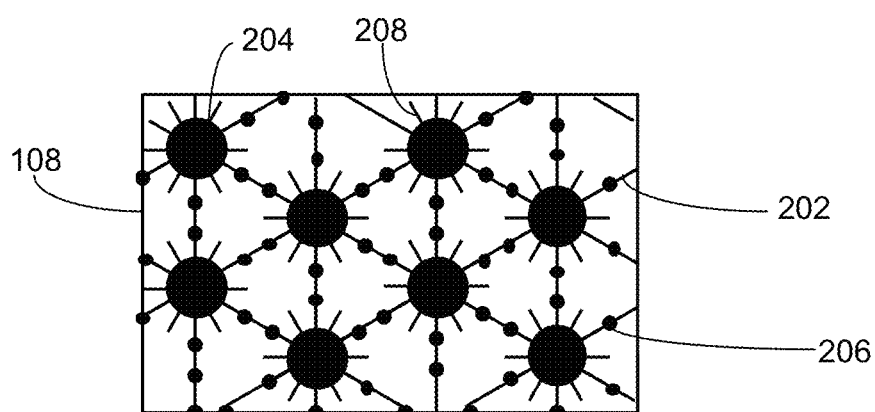

The emissive layer 108 may include a crosslinked matrix of one or more crosslinked charge transport materials in which quantum dots (QDs) are dispersed. Exemplary matrix structures are schematically shown in FIGS. 2 and 3. In some embodiments, and with additional reference to FIG. 2, the crosslinked charge transport material 202 may form a conductive insoluble matrix that disperses the QDs 204. The term "insoluble", as used herein in connection with "insoluble matrix", is indicative of the matrix being insoluble in the solvent in which the QDs and the charge transport materials are initially dispersed during formation of the emissive layer, or in a solvent having similar properties to those used to disperse the QDs and the transporting materials. Such similar solvents may have one or more similar properties such as polarity (dielectric constant), protic-aprotic property, and the like. The similar solvent may be an "orthogonal solvent" in that it is does not dissolve the matrix deposited from the other solvent. As such, the conductive insoluble matrix may be insoluble in orthogonal solvents.

As shown in FIG. 2, the charge transport materials are joined at bond locations 206 to form the matrix, and the QDs 204 are dispersed and retained within the cross-linked matrix. In other embodiments, and with additional reference to FIG. 3, the crosslinked charge transport material 202 may form the conductive insoluble matrix together with the QDs 204. As shown, the charge transport materials are joined at respective bond locations 206 to form the matrix, and the QDs 204 are also joined at respective bond locations 206 to the charge transport material 202. As such, the QDs 204 form a part of the matrix network. In some embodiments, the one or more charge transport materials may be UV-induced crosslinked charge transport materials.

Exemplary QDs 204 include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_xTe_{1-x}$, $ZnSe_xTe_{1-x}$, perovskites of the form $ABX_3$, $Zn_wCu_zIn_{1-(w+z)}S$, and carbon, where $0 \leq w, x, y, z \leq 1$ and $(w+z) \leq 1$. The QDs 204 may be embodied as nanoparticles. In some embodiments, the QDs 204 include ligands 208. The ligands may be provided on the outer surface of the QDs. As an example, the quantum dots may include a core, a shell around the core, and ligands around the shell. In other embodiments, the quantum dots may include a core, a shell around the core, an oxide layer (e.g. an $Al_2O_3$ layer or a layer of another suitable metal oxide), and ligands around the oxide layer. In some examples, the ligand 208 may be an organic material that makes the QDs 204 dispersible in the crosslinkable charge transport material that is used in forming the emissive layer 108. In some examples, the ligands include a functional group that may interact with the crosslinkable charge transport material (e.g., via external stimuli such as temperature, pressure, and/or radiation) in forming the emissive layer (e.g., in the manner shown in FIG. 3). Exemplary functional groups of the ligands may include thiols, alkenes, alkynes, carbonyl and/or carboxyl functional groups. As shown in FIG. 2, while the QDs may include ligands, they may not interact with the charge transport material in forming the matrix. But as shown in FIG. 3, the ligands and charge transport material may be selected such that the ligand does interact with the charge transport material to incorporate the QDs as part of the formed matrix. Of course, in other embodiments, the QDs may not include ligands.

Exemplary UV-induced crosslinked charge transport materials 202 include UV-induced crosslinked hole transport materials and/or UV-induced crosslinked electron transport materials. Accordingly, the matrix of one or more UV-induced crosslinked charge transport materials may be formed from one or more types of crosslinkable materials. Such materials include one or more hole transport materials and/or one or more electron transport materials. In some embodiments, the crosslinkable hole transport material may be a material which is an effective hole transporter both without and with crosslinking. In other embodiments, the crosslinkable hole transport material may be a material which is an effective hole transporter only when crosslinked. In some embodiments, the crosslinkable electron transport material may be a material which is an effective electron transporter both without and with crosslinking. In other embodiments, the crosslinkable electron transport material may be a material which is an effective electron transporter only when crosslinked. In some embodiments, the crosslinked charge transport materials 202 can include one or more of hole injection materials, electron injection materials, hole blocking materials, electron blocking materials, and/or interconnecting materials (ICM).

In some embodiments, the crosslinkable material from which the UV-induced crosslinked charge transport material may be formed includes at least two moieties with different characteristics. As an example, one of the at least two moieties of the molecule may provide charge transporting properties and another of the at least two moieties of the molecule may provide UV-cross-linking capabilities. Exemplary moieties that may provide charge transporting properties include, but are not limited to, tertiary, secondary, and primary aromatic or aliphatic amines, tryaryl phosphines, and quinolinolates. Exemplary moieties that may provide UV-cross-linking capabilities include, but are not limited to, oxetane, epoxy, thiol, alkene, alkyne, ketone, and aldehyde units. In some implementations, the two moieties may be connected and between them there may be a distance of less than 20 nm.

One example of a crosslinkable material from which the UV-induced crosslinked hole transport material may be formed is N4,N4'-Bis(4-(6-((3-ethyloxetan-3-yl)methoxy)hexyl)phenyl)-N4,N4'-diphenylbiphenyl-4,4'-diamine (OTPD), shown below in Formula 1. In some embodiments, the crosslinkable material shown in Formula 1 may be used in forming the matrix shown in FIG. 2.

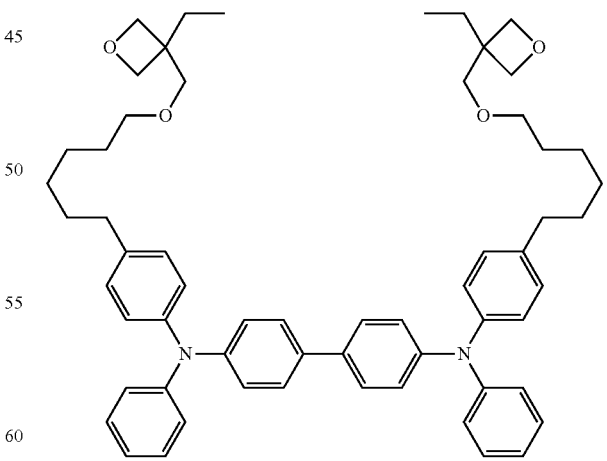

Formula 1

Another example of a crosslinkable material from which the UV-induced crosslinked hole transport material may be formed is N4,N4'-Bis(4-(6-((3-ethyloxetan-3-yl)methoxy)hexyloxy)phenyl)-N4,N4'-bis(4-methoxyphenyl) biphenyl-4,4'-diamine (QUPD), shown below in Formula 2. In some embodiments, the crosslinkable material shown in Formula 2 may be used in forming the matrix shown in FIG. 2.

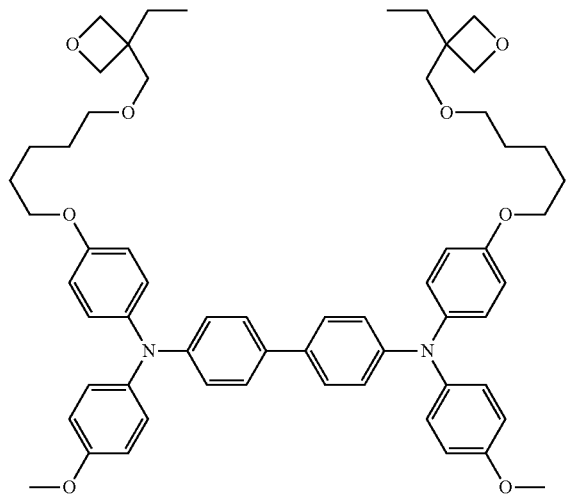

Formula 2

Another example of a crosslinkable material from which the UV-induced crosslinked hole transport material may be formed is N, N'-(4,4'-(Cyclohexane-1,1-diyl) bis(4,1-phenylene))bis(N-(4-(6-(2-ethyloxetan-2-yloxy)hexyl)phenyl)-3,4,5-trifluoroaniline) (X-F6-TAPC), shown below in Formula 3. In some embodiments, the crosslinkable material shown in Formula 3 may be used in forming the matrix shown in FIG. 2.

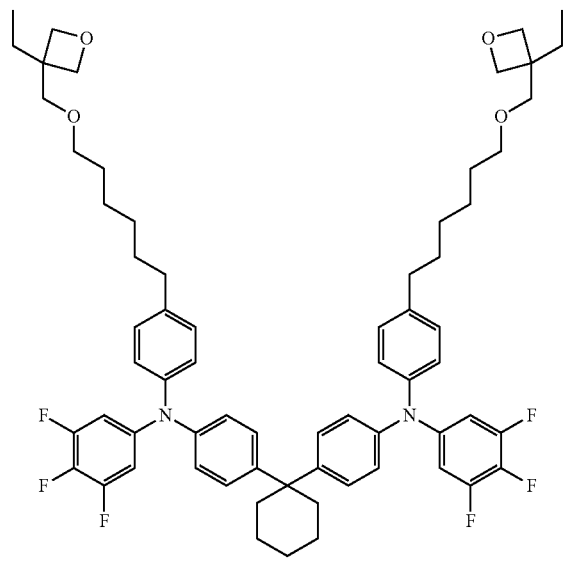

Formula 3

An example of a crosslinkable material from which the UV-induced crosslinked electron transport material may be formed is N4,N4'-Di(naphthalen-1-yl)-N 4,N4'-bis(4-vinylphenyl)biphenyl-4,4'-diamine (VNPB), shown below in Formula 4. In some embodiments, the crosslinkable material shown in Formula 4 may be used in forming the matrix shown in FIG. 3.

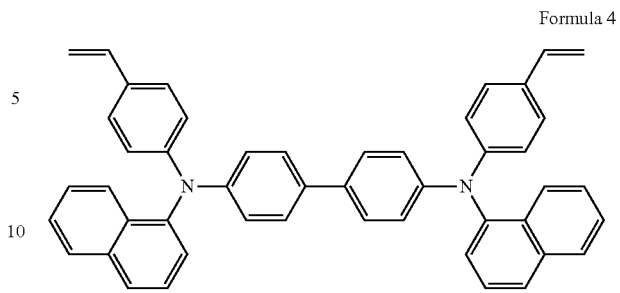

Formula 4

Another example of a crosslinkable material from which the UV-induced crosslinked electron transport material may be formed is 9,9-Bis[4-[(4-ethenylphenyl) methoxy]phenyl]-N2,N7-di-1-naphthalenyl-N2,N7-diphenyl-9H-Fluorene-2,7-diamine (VB-FNPD), shown below in Formula 5. In some embodiments, the crosslinkable material shown in Formula 5 may be used in forming the matrix shown in FIG. 3.

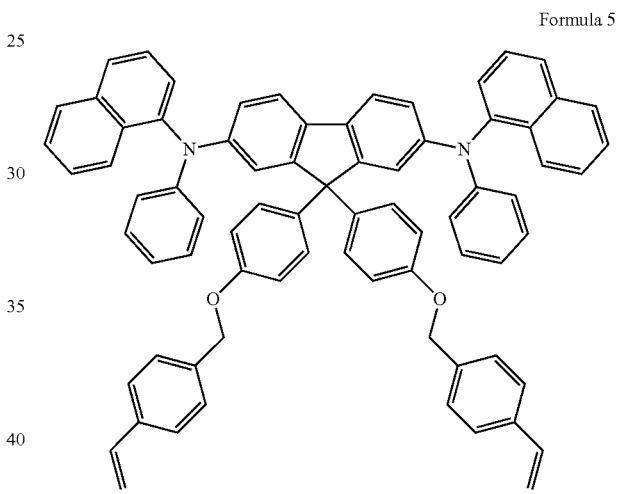

Formula 5

In some embodiments the emissive layer is formed using one or more photo initiators. As such, the emissive layer may include one or more photo initiators. A photo initiator is a material that initiates polymerizations by a light stimuli. In some embodiments, the photo initiator may generate one or more radicals, ions, acids, and/or species that may initiate such polymerization. Examples include, but are not limited to, cationic species and/or radicals, BrOnsted acids, carbenium ions, or onium ions by light irradiation. Exemplary photo initiators include sulfonium- and iodonium-salts (e.g. triphenylsulfonium triflate and diphenyliodonium triflate).

In the embodiments described above, the light-emitting device includes electrodes 104, 106 and an emissive layer 108 disposed between the electrodes. In other embodiments, the light-emitting device may include one or more additional layers. These one or more additional layers may include one or more transport layers (e.g., hole transport layer, electron transport layer) and/or one or more injection layers (e.g., hole injection layer, electron injection layer).

Figure 4:
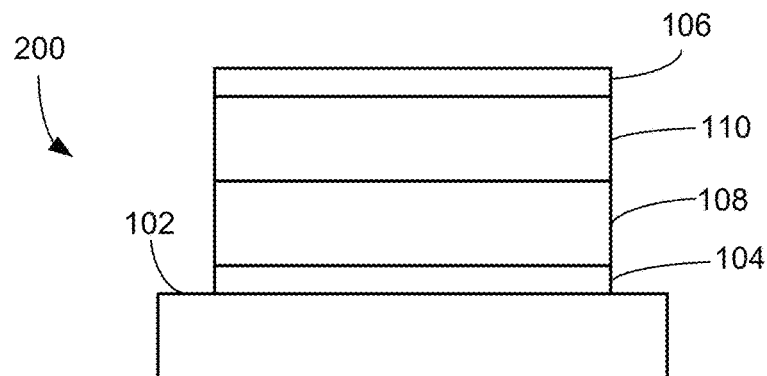
FIGS. 4-6 are schematic cross-sectional views of exemplary light-emitting devices in accordance with the present disclosure.

FIG. 4 shows another exemplary embodiment of a light-emitting device 200. The light-emitting device is similar to the light-emitting device 100 described above, but it additionally includes an electron transport layer 110. As shown, a stack of layers is provided on a substrate 102. The layers include electrodes 104, 106, an emissive layer 108, and an electron transport layer 110. Both the emissive layer 108 and the electron transport layer 110 are disposed between the electrodes, with the emissive layer 108 proximate the anode 104 and the electron transport layer 110 proximate the cathode 106. In some embodiments, such as the one shown, the stack is formed such that the anode is proximate the substrate. Although not specifically shown, in other embodiments, the layers may be stacked on the substrate in reverse order such that the cathode is proximate the substrate. During operation, a bias may be applied between the anode 104 and the cathode 106. The structure may provide for recombination of holes and electrons in a portion of the emission layer 108 proximate the interface of the emission layer 108 and the electron transport layer 110.

The electrodes 104, 106 and the emissive layer 108 may be embodied as any of the embodiments described above (e.g., in connection with FIG. 1). In some embodiments, the emissive layer 108 may be configured such that the UV-induced crosslinked charge transport material includes one or more UV-induced crosslinked hole transport materials.

The electron transport layer 110 may include one or more layers configured to transport electrons therethrough from the cathode to the emissive layer. The electron transport layer 110 may be made from any suitable material(s). In some embodiments, the electron transport layer 110 may include one or more of ZnO, 8-quinolinolato lithium (Liq.), LiF, $Cs_2CO_3$, $Mg_xZn_{1-x}O$ where $0 \leq x \leq 1$, $Al_xZn_{1-x}O$ where $0 \leq x \leq 1$, 2,2',2"-(1,3,5-benzinetriyl)-tris(1-phenyl-1-H-benzimidazole) (TPBi), $TiO_2$, $ZrO_2$, N4,N4'-Di(naphthalen-1-yl)-N4,N4'-bis(4-vinylphenyl) biphenyl-4,4'-diamine (VN-PB), and 9,9-Bis[4-[(4-ethenylphenyl) methoxy]phenyl]-N2,N7-di-1-naphthalenyl-N2,N7-diphenyl-9H-Fluorene-2,7-diamine (VB-FNPD). In embodiments where the electron transport layer 110 includes more than one layer, the material of one of the respective layers may differ from the material of one or more of the other layers(s).

In some embodiments, the electron transport layer does not include a crosslinkable transport material. In other embodiments, the electron transport material includes one or more crosslinkable transport materials. In embodiments where the electron transport material includes one or more crosslinkable transport materials, the crosslinked matrix within the emissive layer may be crosslinked to (and extend into) the electron transport layer. This crosslinking is exemplified in FIGS. 7 and 8.

Figure 5:
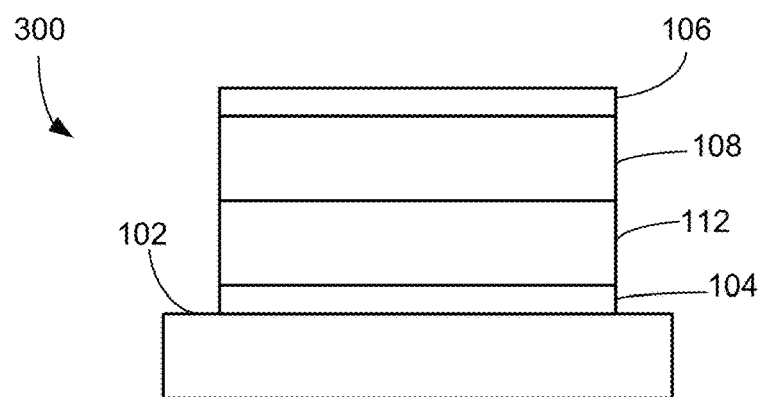

FIG. 5 shows another exemplary embodiment of a light-emitting device 300. The light-emitting device 300 is similar to the light-emitting device 100 described above, but it additionally includes a hole transport layer 112. As shown, a stack of layers is provided on a substrate 102. The layers include electrodes 104, 106, an emissive layer 108, and a hole transport layer 112. Both the emissive layer 108 and the hole transport layer 112 are disposed between the electrodes, with the emissive layer 108 proximate the cathode 106 and the hole transport layer 112 proximate the anode 104. In some embodiments, such as the one shown, the stack is formed such that the anode is proximate the substrate. Although not specifically shown, in other embodiments, the layers may be stacked on the substrate in reverse order such that the cathode is proximate the substrate. During operation, a bias may be applied between the anode 104 and the cathode 106. The structure may provide for recombination of holes and electrons in a portion of the emission layer 108 proximate the interface of the emission layer 108 and the hole transport layer 112.

The electrodes 104, 106 and the emissive layer 108 may be embodied as any of the embodiments described above (e.g., in connection with FIG. 1). In some embodiments, the emissive layer 108 may be configured such that the UV-induced crosslinked charge transport material includes one or more UV-induced crosslinked electron transport materials.

The hole transport layer 112 may include one or more layers configured to transport holes therethrough from the anode to the emissive layer. The hole transport layer 106 may be made from any suitable material(s). In some embodiments, the hole transport layer 112 may include one or more of poly(3,4-ethylenedioxythiophene): poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N,N'-bis(4-butylphenyl)-N,N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl) biphenyl-4,4'-diamine (QUPD), and N,N'-(4,4'-(Cyclohexane-1,1-diyl) bis(4,1-phenylene))bis(N-(4-(6-(2-ethyloxetan-2-yloxy)hexyl)phenyl)-3,4,5-trifluoroaniline) (X-F6-TAPC). In embodiments where the hole transport layer 112 includes more than one layer, the material of one of the respective layers may differ from the material of one or more of the other layers(s).

In some embodiments, the hole transport layer does not include a crosslinkable transport material. In other embodiments, the hole transport material includes one or more crosslinkable transport materials. In embodiments where the hole transport material includes one or more crosslinkable transport materials, the crosslinked matrix within the emissive layer may be crosslinked to (and extend into) the hole transport layer. This crosslinking is exemplified in FIGS. 7 and 8.

Figure 6:
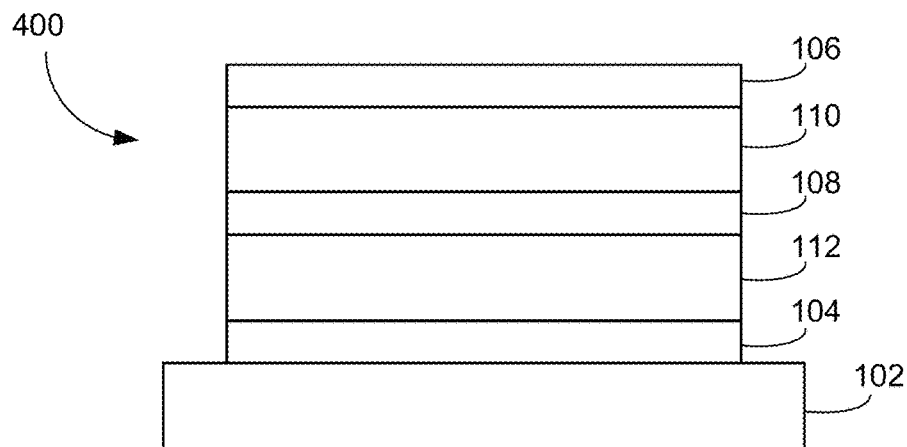

FIG. 6 shows another exemplary embodiment of a light-emitting device 400. The light-emitting device 400 is similar to the light-emitting device 100 described above, but it additionally includes a hole transport layer 112 and an electron transport layer 110. As shown, a stack of layers is provided on a substrate 102. The layers include electrodes 104, 106; charge transport layers 110, 112; and an emissive layer 108. In the exemplary embodiment shown, the charge transport layers 110, 112 are disposed between the electrodes 104, 106 and the emissive layer 108 is disposed between the charge transport layers 110, 112.

In some embodiments, such as the one shown, the stack is formed such that the anode is proximate the substrate. Accordingly, in the illustrated embodiment, the order of the layers moving away from the substrate is an anode 104, hole transport layer 112, emissive layer 108, electron transport layer 110, and cathode 106. Although not specifically shown, in other embodiments, the layers may be stacked on the substrate in reverse order such that the cathode is proximate the substrate. During operation, a bias may be applied between the anode 104 and the cathode 106. The cathode 106 injects electrons into the electron transport layer 110 adjacent to it. Likewise, the anode 104 injects holes into the hole transport layer 112 adjacent to it. The electrons and holes respectively propagate through the hole transport layer and the electron transport layer to the emissive layer 108 where they radiatively recombine and light is emitted.

The electrodes 104, 106 and the emissive layer 108 may be embodied as any of the embodiments described above (e.g., in connection with FIGS. 1, 4 and 5). The electron transport layer 110 may be embodied as any of the embodiments described above (e.g., in connection with the embodiment of FIG. 4). In some embodiments, the electron transport layer 110 and the emissive layer 108 include the same electron transport material. In other embodiments, the electron transport layer 110 and the emissive layer 108 include different respective electron transport materials. The hole transport layer 112 may be embodied as any of the embodiments described above (e.g., in connection with the embodiment of FIG. 5). In some embodiments, the hole transport layer 112 and the emissive layer 108 include the same hole transport material. In other embodiments, the hole transport layer 112 and the emissive layer 108 include different respective hole transport materials.

In still other embodiments, the light-emitting device may include one or more additional layers. Examples include a hole injection layer and/or an electron injection layer. Exemplary materials suitable for use in a hole injection layer include, but are not limited to, poly(3,4-ethylenedioxythiophene) polystyrene sulfonate (PEDOT:PSS), $MoO_3$:PEDOT:PSS; $V_2O_5$, $WO_3$, $MoO_3$, 2,3,5,6-tetrafluoro-7,7,8,8-tetracyanoquinodimethane (F4TCNQ), and/or 1,4,5,8,9,11-hexaazatriphenylenehexacarbonitrile (HATCN). Exemplary materials suitable for use in an electron injection layer include, but are not limited to, 8-quinolinolato lithium (Liq), LiF, and/or $Cs_2CO_3$.

Figure 7:
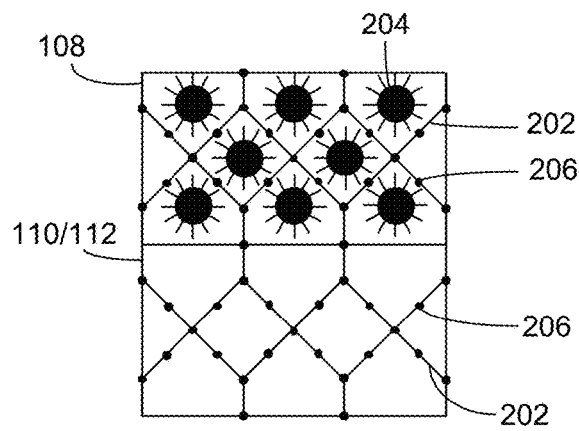
FIGS. 7 and 8 are schematic cross-sectional views of parts of crosslinked emissive layers in accordance with the present disclosure crosslinked together with an adjacent charge transport layer.
Figure 8:
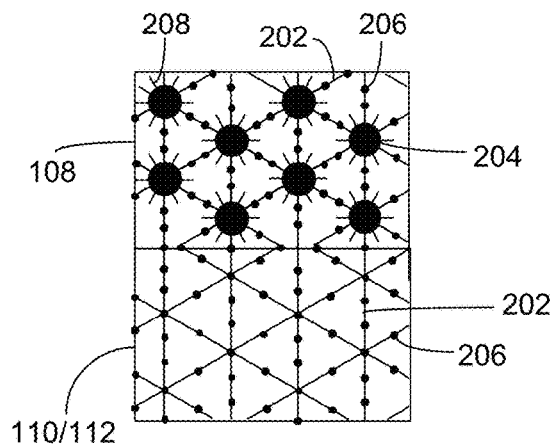

As exemplified in the embodiments described in connection with FIGS. 4-6, the emissive layer 108 may be adjacent a hole transport layer 112 and/or an electron transport layer 110. In some embodiments, the electron transport layer 110 and/or the hole transport layer 112 does not include a crosslinkable transport material. In other embodiments, the electron transport material of the electron transport layer 110 and/or the hole transport material of the hole transport layer 112 includes one or more crosslinkable transport materials. As such, in some embodiments, the crosslinked matrix within the emissive layer may be crosslinked to (and extend into) the electron transport layer 110 and/or the hole transport layer 112. This is exemplified in FIGS. 7 and 8. FIG. 7 shows a cross-sectional view of exemplary interactions occurring using an additional crosslinkable material as charge transport material in the adjacent charge transport layer 110/112, where the structure of the emissive layer 108 is similar to that described in connection with FIG. 2. FIG. 8 shows a cross-sectional view of exemplary interactions occurring using an additional crosslinkable material as charge transport material in the adjacent charge transport layer 110/112, where the structure of the emissive layer 108 is similar to that described in connection with FIG. 3. Interactions at the interfaces between charge transport layer and the emissive layer promote anchoring between the adjacent layers. While FIGS. 7 and 8 show the crosslinking between two adjacent layers, although not specifically shown, in some embodiments (e.g., such as that in FIG. 6 where the emissive layer 108 is adjacent both the electron transport layer 110 and the hole transport layer 112) the emissive layer 108 may be crosslinked with both the electron transport layer 110 and with the hole transport layer 112.

Figure 9:
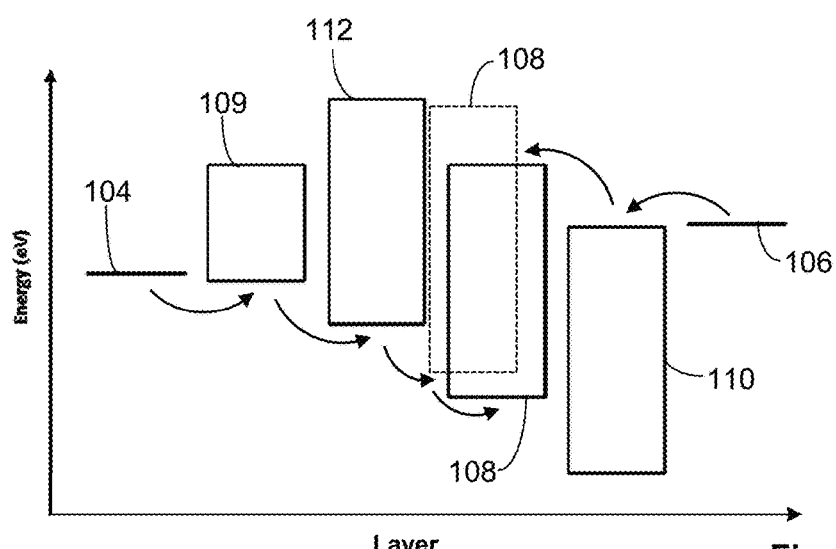
FIG. 9 is an energy diagram of an exemplary embodiment of a light-emitting device produced in accordance with the present disclosure.

FIG. 9 shows an energy diagram of an exemplary embodiment of a light-emitting device produced in accordance with the present disclosure. It is noted that the device depicted in the energy diagram includes a hole injection layer 109 disposed between the anode 104 and the hole transport layer 112. The diagram demonstrates that when the emissive layer includes a crosslinked hole transport material (dotted box 108), the difference of energy between the ionization potential of the emissive layer 108 and of the hole transport layer 110 is decreased as compared to when the emissive layer does not include the crosslinked hole transport material (solid box 108). Although not shown, a similar effect may be achieved when the emissive layer includes a crosslinked electron transport material: the difference of energy between the electron affinity of the emissive layer and of the electron transport layer would be decreased as compared to when the emissive layer does not include the crosslinked hole transport material.

Figure 10A:
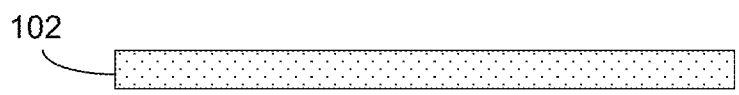
FIGS. 10A-10E are schematic cross-sectional views showing production of parts of an exemplary light-emitting device produced in accordance with an exemplary method of the present disclosure.
Figure 10B:

Turning now to FIGS. 10A-10E, an exemplary method of producing the crosslinked emissive layer is described. As shown in FIG. 10A, a substrate 102 is provided. As shown in FIG. 10B, an electrode 104 is deposited on the substrate 102. The electrode 104 may be deposited on the substrate using any suitable method. Examples include sputtering, evaporative coating, printing, chemical vapor deposition, and the like. As described above, the deposited electrode may be provided in any suitable form. One exemplary implementation is an electrode for a TFT circuit.

Figure 10C:
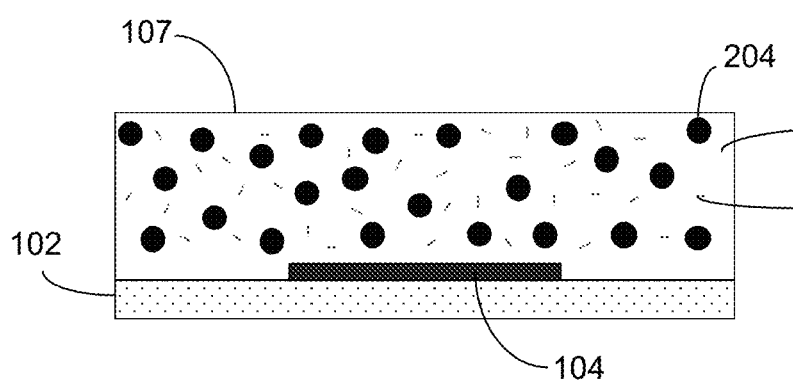

As shown in FIG. 10C, a mixture 107 of UV-induced crosslinkable charge transport material 202 and QDs 204 in a solvent 205 is deposited on top of the electrode 104 and the substrate 102. In some embodiments, the mixture 107 additionally includes photo initiator. The charge transport material 202 may include one or more crosslinkable hole transport materials and/or one or more crosslinkable electron transport materials. The crosslinkable charge transport material may include at least two moieties with different characteristics. As an example, one of the at least two moieties of the molecule may provide charge transporting properties and another of the at least two moieties of the molecule may provide UV-cross-linking capabilities. In some embodiments, the QDs 204 include ligands. Exemplary hole transport materials and/or one or more charge transport materials and QDs are described above. In some embodiments, the UV-induced crosslinkable charge transport material may include one or more of the structure shown above in Formulas 1-3.

The solvent 205 may be any suitable solvent. In some embodiments, the solvent 205 is selected such that the QDs and crosslinkable charge transport materials (and photo initiator, if included) are soluble therein. Exemplary solvents include, but are not limited to the following or mixtures including the following: acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA). The particular solvent that is utilized may depend on the specific charge transporting material, QDs, and photo initiator that are selected.

Figure 10D:
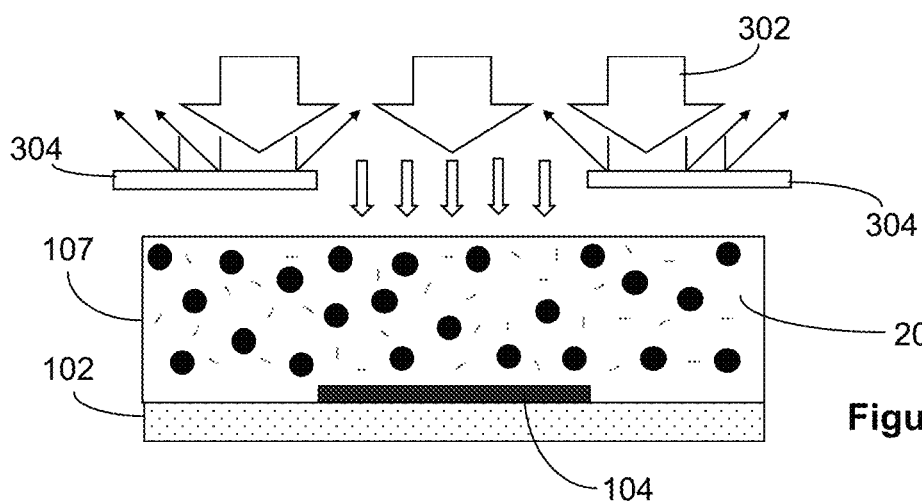
Figure 10E:
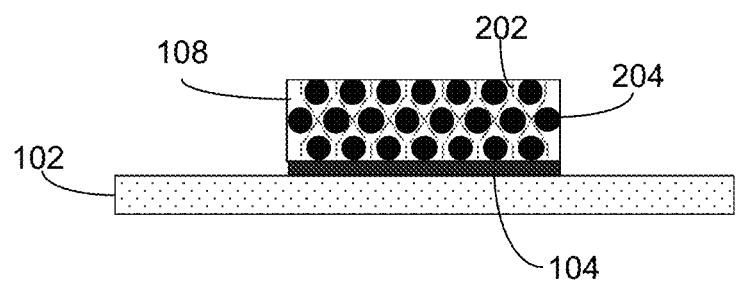

As shown in FIG. 10D, UV light 302 is applied though a mask 304 that provides a shape/pattern through which the desired area of the mixture 107 is exposed. Exposure of the mixture 107 to UV light results in the cross-linking of the charge transport material. In embodiments where the mixture includes photo initiator, the photo initiator may assist in initializing the cross-linking of the charge transport material. The cross-linking of the charge transport material results in dispersion of the QDs throughout the formed crosslinked matrix of the charge transport material. The crosslinked mixture forms the emissive layer 108, which is insoluble. The remaining mixture may be washed away with a solvent. In some embodiments, the solvent is the same solvent used in the mixture 107 that is deposited in FIG. 10C. In other embodiments, the solvent is a similar solvent or orthogonal solvent to the solvent used in the mixture 107 that is deposited in FIG. 10C. Accordingly, as shown in FIG. 10E, the crosslinked emissive layer 108 remains on the electrode 102. As shown, the QDs 204 are dispersed in the solid matrix formed by crosslinking the charge transport material 202.

The solvent used in the mixture 107 and/or the solvent used to wash away the remaining mixture may be evaporated during curing (e.g., heating) of the deposited layer. The curing may be performed at any suitable temperature that effectuates evaporation of the solvent while also maintaining the integrity of the QDs and charge transport material. In some embodiments, curing may be performed at a temperature ranging from 5° C. to 150° C. In other embodiments, curing may be performed at a temperature ranging from 30° C. to 150° C. In other embodiments, curing may be performed at a temperature ranging from 30° C. to 100° C.

As an example, subsequent to the application of UV light (as shown in FIG. 10D), the layer may be cured (e.g., heated) to facilitate evaporation/removal of the solvent(s). This curing may be performed prior to the washing or subsequent to the washing. In those implementations where the curing is performed prior to the washing, a subsequent curing may be performed after washing. As another example, application of UV light (as shown in FIG. 10D) and curing (e.g., heating) may be performed in parallel. This may remove the solvent used in the mixture 107. Subsequent to the washing, a subsequent curing may be performed. As yet another example, curing may be conducted prior application of UV light (as shown in FIG. 10D). Subsequent to the washing, a subsequent curing may be performed.

Factors such as the UV exposure times, UV-intensity, amount of photo initiator and ratio between UV-reactive moieties may allow for control of the morphology of the emissive material. For example, UV exposure time may in some embodiments range from 0.1 second to 15 minutes. UV exposure intensity may range from 0.1 to 100,000 mJ/cm$^2$. The amount of photo initiator may range from 0.001 to 10 wt % of the mixture. The ratio between UV reactive moieties may range from 0.001 to 1. In one exemplary implementation, the UV exposure intensity ranges from 1 to 100 mJ/cm$^2$ at a UV exposure time of 1 to 10 seconds.

Turning now to FIGS. 11A-11E, another exemplary method of producing the crosslinked emissive layer is described. The method described in connection with FIGS. 11A-11E is similar to the method described in connection with FIGS. 10A-10E, but the mixture 107 from which the emissive layer is formed includes a combination of QDs having ligands and charge transport material that may interact to form the matrix with the QDs integrated therein.

Figure 11A:
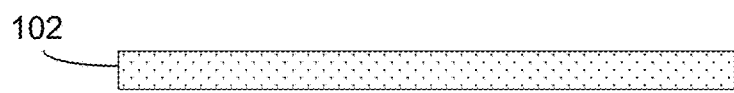
FIGS. 11A-11E are schematic cross-sectional views showing production of parts of an exemplary light-emitting device produced in accordance with an exemplary method of the present disclosure.
Figure 11B:
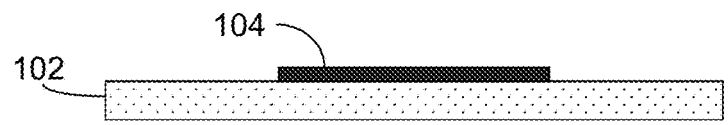

As shown in FIG. 11A, a substrate is provided. As shown in FIG. 11B, an electrode 104 is deposited on the substrate 102. The electrode 104 may be deposited on the substrate using any suitable method. Examples include sputtering, evaporative coating, printing, chemical vapor deposition, and the like. As described above, the deposited electrode may be provided in any suitable form. One exemplary implementation is an electrode for a TFT circuit.

Figure 11C:
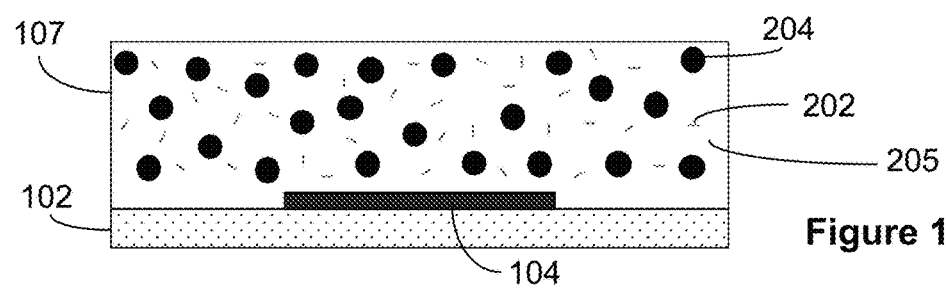

As shown in FIG. 11C, a mixture 107 of UV-induced crosslinkable charge transport material 202 and QDs 204 in a solvent 205 is deposited on top of the electrode 104 and the substrate 102. The crosslinkable charge transport material 202 may include at least two moieties with different characteristics. As an example, one of the at least two moieties of the molecule may provide charge transporting properties and another of the at least two moieties of the molecule may provide UV-cross-linking capabilities. Furthermore, the QDs 204 include crosslinkable ligands. The ligands may contain a functional group X that may interact with a functional group Y of the UV-induced crosslinkable charge transport material. The UV-induced crosslinkable charge transport material may include such functional group Y at two or more molecular sites. For example, the functional group X may be at the end of the ligand; the functional groups Y may be at two ends of the hole transport and/or electron transport materials. In one implementation, the functional groups X may be a thiol, and the function groups Y may be an alkene or alkyne, or vice versa. Exemplary UV-induced crosslinkable charge transport material including such functional groups are shown above in Formulas 4 and 5.

Ligands of the QDs and charge transporting materials included in the emissive layer can be selected in order to create uniform dispersion in the deposition solvent. Materials with similar polarity indexes can be selected in order to ensure homogeneity of the deposited mixtures.

The solvent may be any suitable solvent. In some embodiments, the solvent is selected such that the QDs and crosslinkable charge transport materials (and photo initiator, if included) are soluble therein. Exemplary solvents include, but are not limited to the following or mixtures including the following: acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA). The particular solvent that is utilized may depend on the specific charge transporting material, QDs, and photo initiator that are selected.

Figure 11D:
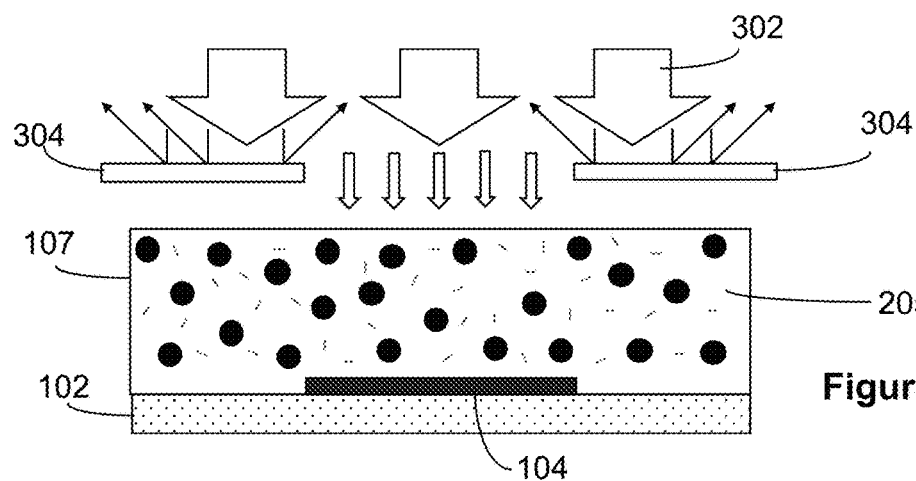
Figure 11E:
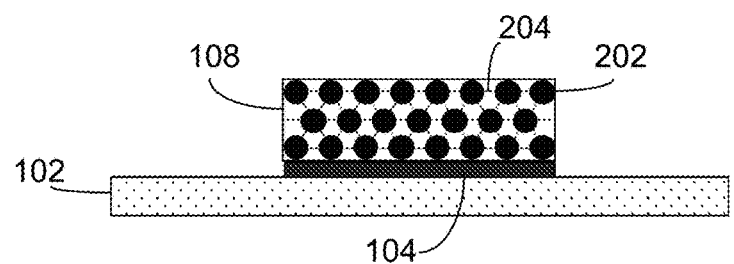

As shown in FIG. 11D, UV light 302 is applied though a mask 304 that provides a shape/pattern through which the desired area of the mixture 107 is exposed. Exposure of the mixture 107 to UV light results in the crosslinking of the charge transport material together, and in the crosslinking of the charge transport material together with the QDs (via the ligands). In embodiments where the mixture includes photo initiator, the photo initiator may assist in initializing the cross-linking of the charge transport material and QDs. The cross-linking results in the QDs being incorporated into the solid matrix, and thereby dispersed in the emissive layer. The crosslinked mixture is insoluble, and the remaining mixture may be washed away with a solvent. In some embodiments, the solvent is the same solvent used in the mixture 107 that is deposited in FIG. 11C. In other embodiments, the solvent is a similar solvent or orthogonal solvent to the solvent used in the mixture 107 that is deposited in FIG. 11C. Accordingly, as shown in FIG. 11E, the crosslinked emissive layer 108 remains on the electrode 102. As shown, the QDs form the solid matrix together with the charge transport material, and are thereby dispersed therein.

The solvent used in the mixture 107 and/or the solvent used to wash away the remaining mixture may be evaporated during curing (e.g., heating) of the deposited layer. The curing may be performed at any suitable temperature that effectuates evaporation of the solvent while also maintaining the integrity of the QDs and charge transport material. In some embodiments, curing may be performed at a temperature ranging from 5° C. to 150° C. In other embodiments, curing may be performed at a temperature ranging from 30° C. to 150° C. In other embodiments, curing may be performed at a temperature ranging from 30° C. to 100° C.

As an example, subsequent to the application of UV light (as shown in FIG. 11D), the layer may be cured (e.g., heated) to facilitate evaporation/removal of the solvent(s). This curing may be performed prior to the washing or subsequent to the washing. In those implementations where the curing is performed prior to the washing, a subsequent curing may be performed after washing. As another example, application of UV light (as shown in FIG. 11D) and curing (e.g., heating) may be performed in parallel. This may remove the solvent used in the mixture 107. Subsequent to the washing, a subsequent curing may be performed. As yet another example, curing may be conducted prior application of UV light (as shown in FIG. 11D). Subsequent to the washing, a subsequent curing may be performed.

Factors such as the UV exposure times, UV-intensity, amount of photo initiator and ratio between UV-reactive moieties may allow for control of the morphology of the emissive material. For example, UV exposure time may in some embodiments range from 0.1 second to 15 minutes. UV exposure intensity may range from 0.1 to 100,000 $mJ/cm^2$. The amount of photo initiator may range from 0.001 to 10 wt % of the mixture. The ratio between UV reactive moieties may range from 0.001 to 1. In one exemplary implementation, the UV exposure intensity ranges from 1 to 100 $mJ/cm^2$ at a UV exposure time of 1 to 10 seconds.

It is noted that while the examples described in connection with FIGS. 10A-10E and 11A-11E indicate "UV irradiation" and "UV-induced cross-linkable", in some embodiments, it is possible to use other forms of radiation, such as electromagnetic radiation with wavelengths other than in the UV spectral range.

As a further step in either of the above-described methods, an additional electrode may be formed on the upper surface of the emissive layer 108. The electrode may be formed by a method such as, but not limited to, sputtering, printing, chemical vapor deposition, and the like. As such, the structure may form a light-emitting device have the structure shown in FIG. 1 having an anode, emissive layer, and cathode.

The above-described methods shown in FIGS. 10A-10E and 11A-11E describe the formation of the emissive layer on the electrode. It will be understood that the methods are illustrative of the formation of the emissive layer, and that such methods can be implemented on layers other than the electrode. For example, the emissive layer may be formed in accordance with the methods shown in FIGS. 10A-10E and 11A-11E on a charge transport layer. The charge transport layer may be deposited (e.g., coated) and cured (e.g., heated) prior to deposition of the emissive layer. In some embodiments, the charge transport layer on which the emissive layer is formed may include crosslinkable charge transport material. Functional groups X or Y may be at one or more sites in the molecule (e.g. at one or more ends of the molecule). When UV irradiation is applied, the molecules of charge transport layer(s) can create interactions at the interface with the emissive layer. This structure is exemplified in FIGS. 7 and 8. With reference to FIG. 7, in the method described in connection with FIGS. 10A-10E, the charge transport material of the charge transport layer(s) can interact with the UV-induced crosslinkable material included in the mixture that forms the emissive layer, thereby extending the conductive insoluble matrix structure into the charge transport layer. With reference to FIG. 8, in the method described in connection with FIGS. 11A-11E, the charge transport material of the charge transport layer(s) can interact with the ligands of the QDs and/or with the UV-induced crosslinkable material, thereby extending the conductive insoluble matrix structure into the charge transport layer.

Furthermore, in some embodiments, in either of the above-described methods, one or more additional layers (e.g., charge transport layer(s) such as hole transport layer and/or electron transport layer) may be formed below (underneath) and/or above (on top) of the emissive layer 108. These layers may be formed via deposition (e.g., coating) and curing (e.g., heating). As such, the structure may form a light-emitting device having the structure shown in any one of FIGS. 4-6 and 9.

In some examples, the one or more additional layers (e.g., charge transport layer(s) such as hole transport layer and/or electron transport layer) may be deposited by a method such as, but not limited to: dip coating, spin coating, spray coating, slot-die process or various printing methods such as inkjet printing. These additional layers may act as transporting, injecting or blocking layers for holes or electrons. The electrode may be formed by a method such as, but not limited to, sputtering, evaporative coating, printing, chemical vapor deposition, and the like.

The above-described methods are described as providing a single light emissive device. It will be appreciated that, in some embodiments, the patterning of the mask may allow for multiple (e.g., an array) of light-emitting devices to be formed in different regions of the substrate. Furthermore, either of the above-described methods can be repeated in order to form light-emitting devices having different QDs (e.g. QDs that emit different colors (e.g. R, G, B)) in different regions of the substrate, as determined by the patterning of the mask. The arrangement of light-emitting devices may form sub-pixel arrangements, as well as pixel arrangements.

Figure 12A:
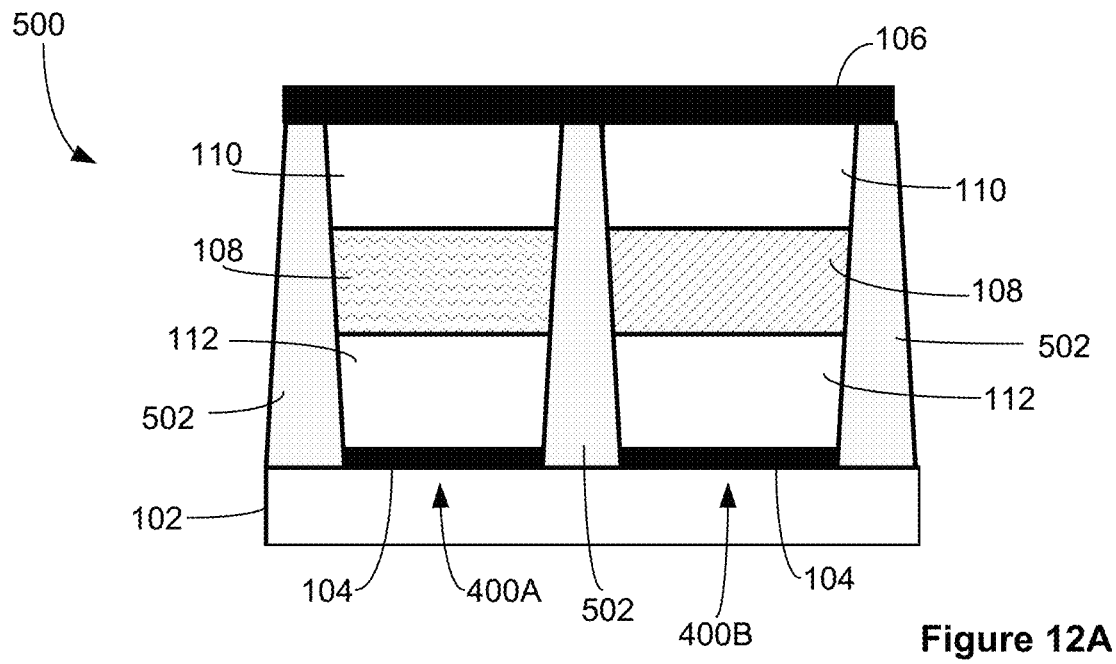
FIG. 12A is a schematic cross-sectional view of two patterned subpixels in accordance with an exemplary embodiment of the present disclosure.
Figure 12B:
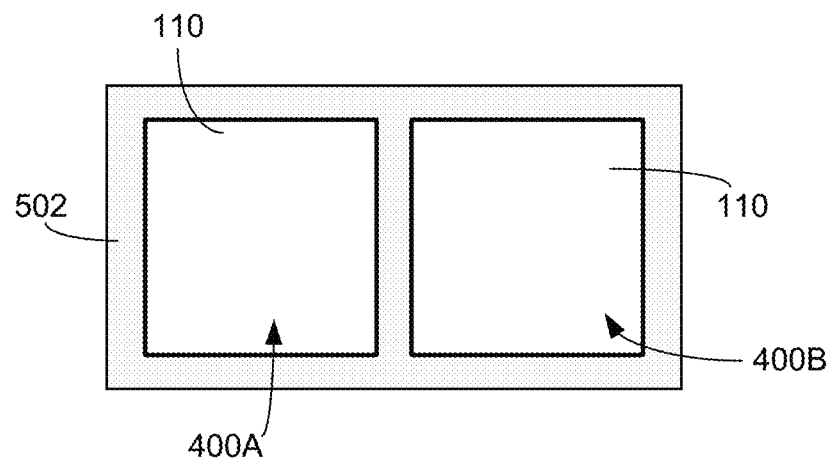
FIG. 12B is a schematic top view of the exemplary embodiment of FIG. 12A without the common cathode shown.

In some embodiments, these light-emitting devices may be arranged such that they are separated by one or more insulating materials. This arrangement may also be referred to as a "bank structure." FIGS. 12A and 12B show such an exemplary arrangement of light-emitting devices at 500. FIGS. 12A and 12 B are not drawn to scale and are used to show the salient features of the bank structure. As shown, different subpixels 400A, 400B are patterned in the same substrate, and the insulating material 502 delineates the areas where the materials that constitute the QLED subpixel structures are deposited. FIGS. 12A and 12B show an exemplary arrangement of two light-emitting devices arranged as subpixels. In other embodiments, the subpixel arrangement may include any suitable number of subpixels (e.g., three, four, etc.). The different subpixels may be configured to emit light of different colors.

Exemplary insulating materials may include, but are not limited to, polyimides. In some examples, the insulating material may include surface treatment (e.g. fluorine) in order to modify its wetting properties (e.g. made hydrophilic to prevent the deposited material from sticking on the banks and to ensure the subpixel is filled properly). The insulating material 502 forms wells, and the bottoms include different electrodes for each subpixel (e.g., anodes). In the embodiment shown the light-emitting devices include electrodes 104, 106, hole transport layer 112, emissive layer 108, and electron transport layer 110 (similar to the arrangement shown in FIG. 6. In other embodiments (not shown) the light-emitting devices of the bank structure may instead be similar to the structures of the devices shown in FIG. 1, 4, or 5. The hole transport layer 112 may be deposited commonly or individually (as shown) for the different subpixels. The emissive layers 108 of the respective subpixel 400A, 400B may be sequentially deposited in the different respective subpixel areas. Crosslinking of the emissive layers may be conducted in accordance with the methods described above. The electron transport layer may be deposited commonly or individually (as shown) for the different subpixels. A common top electrode (cathode for standard structure) is deposited to complete the subpixels structure; although the top electrode is illustrated as a flat layer in FIG. 12A, the structure is not necessarily planar prior to the deposition of said electrode.

Example—Production of a Light-Emitting Device 150 nm of ITO is sputtered through a shadow mask onto a 1 mm thick glass substrate to define a semi-transparent anode region. PEDOT:PSS in aqueous solution is deposited on top of the anode by spin coating then baked at 150° C. to form a hole injection layer. OTPD dissolved in chlorobenzene is deposited on top of the hole injection layer by spin coating then baked at 110° C. to form an hole transport layer. CdSe/CdS quantum dots, OTPD, and a photo initiator are deposited and patterned by the above-described deposition method shown in FIGS. 10A-10E. ZnO nanoparticles are deposited on top of the emissive layer by spin coating from ethanol followed by baking at 110° C. to form an electron transport layer. 100 nm of Aluminum is thermally evaporated on top of the electron transport layer to provide a reflective cathode.

The above-described process yields a light-emitting device having a 1 mm glass substrate, 150 nm ITO anode, 50 nm PEDOT:PSS hole injection layer, 40 nm OTPD hole transport layer, 20 nm crosslinked emissive layer having a OTPD crosslinked matrix within which CdSe/CdS QDs are dispersed, 45 nm ZnO electron transport layer, and 100 nm Al cathode.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A method of forming an emissive layer of a light-emitting device, comprising:
depositing a mixture comprising quantum dots comprising ligands and one or more crosslinkable charge transport materials other than the ligands on a layer; and
subjecting at least a portion of the mixture to UV activation to form an emissive layer, the emissive layer comprising the quantum dots dispersed in a crosslinked matrix formed at least partially from the one or more crosslinkable charge transport materials other than the ligands.

2. The method of claim 1, wherein the ligands interact with the one or more crosslinkable charge transport materials, and the quantum dots form part of the crosslinked matrix.

3. The method of claim 1, wherein the ligands are at the outer surface of the quantum dots.

4. The method of claim 1, wherein the mixture further comprises a photo initiator.

5. The method of claim 1, wherein at least one of the one or more crosslinkable materials is a hole transporting material.

6. The method of claim 1, wherein at least one of the one or more crosslinkable materials is an electron transporting material.

7. The method of claim 1, wherein the layer is an electrode.

8. The method of claim 1, wherein the layer is a hole transport layer.

9. The method of claim 8, wherein the hole transport layer comprises a crosslinkable hole transport material, and the UV activation crosslinks the hole transport layer with the matrix of emissive layer.

10. The method of claim 1, wherein the layer is an electron transport layer.

11. The method of claim 10, wherein the electron transport layer comprises a crosslinkable electron transport material, and the UV activation crosslinks the electron transport layer with the matrix of emissive layer.

12. The method of claim 1, wherein the ligands have one or more functional groups.

13. The method of claim 12, wherein the ligands include one or more functional groups that interact with at least one of the one or more crosslinkable charge transport materials in forming the part of the crosslinked matrix, the one or more functional groups comprising a thiol.

14. The method of claim 12, wherein the ligands include one or more functional groups that interact with at least one of the one or more crosslinkable charge transport materials in forming the part of the crosslinked matrix, the one or more functional groups comprising an alkene.

15. The method of claim 12, wherein the ligands include one or more functional groups that interact with at least one of the one or more crosslinkable charge transport materials in forming the part of the crosslinked matrix, the one or more functional groups comprising an alkyne.

16. The method of claim 12, wherein the ligands include one or more functional groups that interact with at least one of the one or more crosslinkable charge transport materials in forming the part of the crosslinked matrix, the one or more functional groups comprising a carbonyl functional group.

17. The method of claim 12, wherein the ligands include one or more functional groups that interact with at least one of the one or more crosslinkable charge transport materials in forming the part of the crosslinked matrix, the one or more functional groups comprising a carboxyl functional group.

18. The method of claim 1, wherein the ligands do not interact with the one or more crosslinkable charge transport materials.

19. The method of claim 1, wherein at least one of the one or more crosslinkable charge transport materials comprises at least one of a tertiary, secondary, or primary aromatic amine.

20. The method of claim 1, wherein at least one of the one or more crosslinkable charge transport materials comprises at least one of an oxetane, epoxy, thiol, alkene, alkyne, ketone, or aldehyde functional group.

* * * * *